United States Patent [19]
Maeda

[11] Patent Number: 6,027,949
[45] Date of Patent: Feb. 22, 2000

[54] METHOD FOR EVALUATING A SEMICONDUCTOR DEVICE

[75] Inventor: Hitoshi Maeda, Tokyo, Japan

[73] Assignee: Mitsubishi Denki Kabushiki Kaisha, Tokyo, Japan

[21] Appl. No.: 08/850,003

[22] Filed: May 1, 1997

[30]  Foreign Application Priority Data

Jan. 7, 1997 [JP] Japan .............................. 9-000563(P)

[51] Int. Cl.$^7$ .................................................. H01L 21/66
[52] U.S. Cl. ........................... 438/14; 438/466; 438/459; 438/977
[58] Field of Search .............................. 438/14, 466, 977, 438/974, 459; 204/907; 205/123, 157, 915

[56]  References Cited

U.S. PATENT DOCUMENTS

| | | |
|---|---|---|
| 2,656,496 | 10/1953 | Sparks . |
| 3,379,625 | 4/1968 | Csabi . |
| 3,660,250 | 5/1972 | Duffy et al. ............................ 204/1 T |
| 3,846,259 | 11/1974 | Duncan et al. . |
| 4,664,762 | 5/1987 | Hirata . |
| 5,338,416 | 8/1994 | Mlcak et al. .......................... 204/129.3 |
| 5,360,521 | 11/1994 | Davis et al. . |
| 5,464,509 | 11/1995 | Mlcak et al. .......................... 204/129.3 |
| 5,525,549 | 6/1996 | Fukada et al. . |

FOREIGN PATENT DOCUMENTS

| | | |
|---|---|---|
| 63-205908 | 8/1988 | Japan . |
| 8-250564 | 9/1996 | Japan . |

OTHER PUBLICATIONS

J. A. M. Dikhoff, Philips Technische Rundschau, vol. 25, No. 12, pp. 441 to 454, "Inhomogenities in doped germanium and silicon crystals", 1963/64, (with partial English translation).

H. Föll, Appl. Phys. Lett, vol. 37, No. 3, pp. 316 to 318, "Anodic Etching of p–Type Silicon as a Method for Discriminating Electrically Active and Inactive Defects", Aug. 1, 1980.

G. A. James, et al., IBM Technical Disclosure Bulletin, vol. 14, No. 11, p. 3261, "Electrochemcial Method for the Measurement of Epitaxial Film Thickness", Apr. 1972.

*Primary Examiner*—Jey Tsai
*Attorney, Agent, or Firm*—Oblon, Spivak, McClelland, Maier & Neustadt, P.C.

[57]  ABSTRACT

A P-type silicon substrate (4) and an N-type diffusion layer region (6) are connected to aluminum electrodes (5 and 7), respectively. Respective sections of the P-type silicon substrate (4) and the N-type diffusion layer region (6) are exposed. The aluminum electrode (5) connected to the P-type silicon substrate (4) and a platinum electrode (1) are connected in common to a cathode of a DC power supply (3a) and the aluminum electrode (7) connected to the N-type diffusion layer region (6) is connected to an anode of the DC power supply (3a). A sample for evaluation is thus provided. Of this sample, the exposed sections of the P-type silicon substrate (4) and the N-type diffusion layer region (6) are dipped into a mixture (2) of hydrofluoric acid and alcohol, and a voltage not lower than a critical voltage is applied thereto by the DC power supply (3a). Thus, an evaluation of a form of a diffusion layer region in a semiconductor device is achieved with excellent reproducibility.

7 Claims, 6 Drawing Sheets

METHOD FOR EVALUATING A SEMICONDUCTOR DEVICE

BACKGROUND OF THE INVENTION

1. Field of the Invention

The present invention relates to a technique for evaluating a form of a diffusion layer region formed in a semiconductor substrate.

2. Description of the Background Art

Evaluating two-dimensional or three-dimension structure of a diffusion layer, which is one of elements constituting a device and on which characteristics of a transistor is highly dependent, is of great importance. For example, a technique for evaluating a form of a diffusion layer region is shown in "Semiconductor Evaluation Technique" (Edited by Takashi Katoda, Sangyo Tosho Publishing Company, 1989, pp. 136 to 137). Specifically, a cleaved sample of semiconductor device is pretreated with Sirtl etchant to manifest a diffusion layer, and then the manifested diffusion layer is evaluated using Scanning Electron Microscopy (SEM). The etch rate of Sirtl etchant to silicon is dependent on an impurity concentration in the silicon, and specifically the silicon is more easily etched as its impurity concentration becomes higher. This method takes advantage of this property of silicon and makes it possible to manifest a diffusion layer region having an impurity concentration of $10^{19}$ atms/cm$^3$ level or more.

In cutting-edge devices, however, with an increase of cases where a diffusion layer region of low impurity concentration is formed in a semiconductor substrate for field relieving, there arises a problem that evaluation of a form of a diffusion layer region of low impurity concentration is not achieved with high accuracy since the diffusion layer region of low impurity concentration can not be manifested by the above pretreatment with the Sirtl etchant.

Further, a silicon oxide film serving as an interlayer insulation film is needlessly etched by the pretreatment with the Sirtl etchant, and accordingly, it becomes difficult to perform a structural evaluation of the whole device with good reproducibility.

SUMMARY OF THE INVENTION

The present invention is directed to a method of evaluating a semiconductor device. According to a first aspect of the present invention, the method comprises the steps of: (a) dipping the semiconductor device having a first region of N-type conductivity and a second region of P-type conductivity into a mixture of hydrofluoric acid and alcohol with at least the first region exposed; and (b) giving the first region a potential higher than that of the mixture which is equal to or higher than that of the second region.

According to a second aspect of the present invention, in the method of the first aspect, the second region is also exposed in the step (a).

According to a third aspect of the present invention, in the method of the first aspect, the first region is a semiconductor substrate and the second region is a diffusion layer region, and the method further comprises the step of (c) thinning the semiconductor substrate to be like a film between the diffusion layer region and the mixture.

According to a fourth aspect of the present invention, in the method of the first, second or third aspect, a potential of the second region is lower than that of the mixture in the step (b).

According to a fifth aspect of the present invention, the method comprises the steps of: (a) dipping the semiconductor device having a first region of N-type conductivity and a second region of P-type conductivity into a metal ion solution with both the first and second regions exposed; and (b) giving the second region a potential lower than that of the metal ion solution which is equal to or lower than that of the first region.

According to a sixth aspect of the present invention, in the method of the fifth aspect, the first region is higher in potential than the metal ion solution in the step (b).

By the method of the first aspect, the first region is electrolytically polished by hydrofluoric acid since it works as an anode and is exposed. On the other hand, the second region does not work as an anode and is not electrolytically polished since a PN junction between the first and second regions is reversely biased. Therefore, an evaluation of a form of an interface between the first and second regions is achieved by observing whether or not being electrolytically polished.

Furthermore, with great potential difference, an evaluation of a form of a diffusion layer region having a low impurity concentration, which has been hard to do, is also achieved.

By the method of the second aspect, only the first region works as an anode and is electrolytically polished though both the first and second regions are exposed. Therefore, a two-dimensional evaluation of a form of the interface between the first and second regions is achieved by observing whether or not being electrolytically polished.

By the method of the third aspect, only the semiconductor substrate working as an anode is electrolytically polished until the diffusion layer region is completely exposed since the semiconductor substrate immediately below the diffusion layer region is thinned in advance to be like a film. Therefore, a three-dimensional evaluation of a form of the diffusion layer region is achieved by observing the structure of the diffusion layer region being completely exposed.

By the method of the fourth aspect, the second region never works as an anode even if there arises a leak current in the PN junction since the potential of the second region is lower than that of the mixture. Therefore, electrolytic polishing of the second region is completely avoided to ensure a more accurate evaluation of a form of the semiconductor device.

By the method of the fifth aspect, only the second region works as a cathode and its surface is metallized though both the first and second regions are exposed since the PN junction between the first and second regions is reversely biased. Therefore, a two-dimensional evaluation of a form of the interface between the first and second regions is achieved by observing whether or not being metallized.

By the method of the sixth aspect, the first region never works as a cathode even if there arises a leak current in the PN junction since the potential of the first region is higher than that of the metal ion solution. Therefore, metallization of the surface of the first region is completely avoided to ensure a more accurate evaluation of a form of the semiconductor device.

An object of the present invention is to provide a technique for evaluating a form of a diffusion layer region formed in a semiconductor substrate with excellent reproducibility.

These and other objects, features, aspects and advantages of the present invention will become more apparent from the following detailed description of the present invention when taken in conjunction with the accompanying drawings.

DESCRIPTION OF THE PREFERRED EMBODIMENTS

The First Preferred Embodiment

Prior to discussion on this preferred embodiment, a principle of manifestation of a diffusion layer region will be described. If a silicon is connected to an anode in a mixture ("mixed etchant" hereinafter) of hydrofluoric acid and alcohol, a porous silicon is formed or the silicon is electrolytically polished.

Formation of porous silicon:

($\lambda<2$, h: positive hole, e: electron)

Electrolytic polishing of silicon:

($\lambda<4$, h: positive hole, e : electron)

Whether a porous silicon is formed or the silicon is electrolytically polished depends on a voltage which is applied to connect the silicon to an anode, and there is a critical voltage. Specifically, with a voltage higher than the critical voltage, the silicon is electrolytically polished and with a voltage lower than the critical voltage, a porous silicon is formed. Being dependent on the impurity concentration in the silicon, the critical voltage becomes higher as an impurity concentration becomes lower.

For example, a sample in which an N-type diffusion layer region is formed inside a P-type silicon substrate is dipped into the mixed etchant and a DC voltage not lower than the critical voltage is applied thereto so that the N-type diffusion layer region may be higher in potential than the P-type silicon substrate and the mixed etchant. Then, the N-type diffusion layer region works as an anode, being supplied with positive holes, and is electrolytically polished. On the other hand, the P-type silicon substrate does not work as an anode and is not electrolytically polished. Accordingly, the N-type diffusion layer region can be manifested by whether or not being electrolytically polished.

Figure 1:
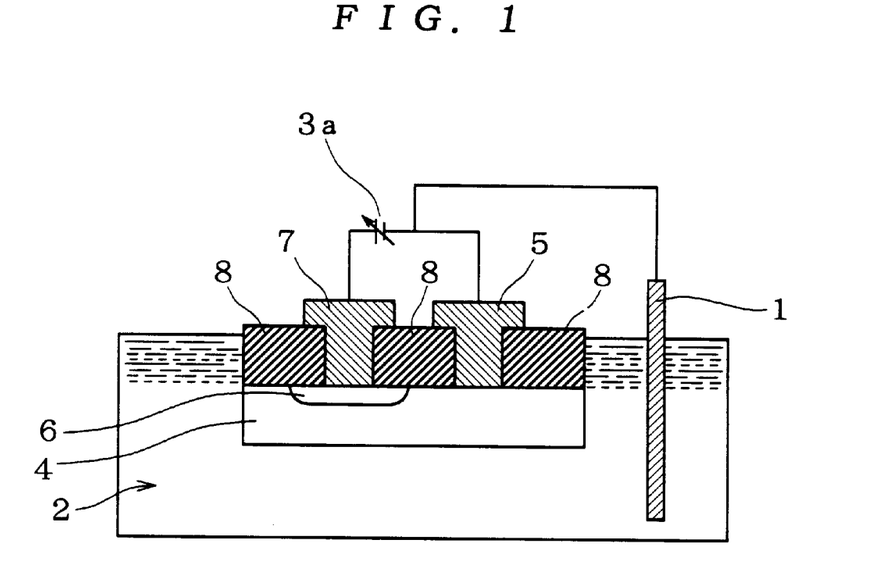
FIGS. 1 and 2 are cross sections each illustrating a method for evaluating a semiconductor device in accordance with a first preferred embodiment of the present invention.

FIG. 1 is a cross section illustrating a method for evaluating a semiconductor device in accordance with the first preferred embodiment of the present invention. First, an N-type diffusion layer region 6 is formed inside a P-type silicon substrate 4. A silicon oxide film, for example, is deposited on the P-type silicon substrate 4 and the N-type diffusion layer region 6 to form an interlayer insulation film 8 and the interlayer insulation film 8 is selectively opened. After that, aluminum electrodes 5 and 7 are provided so as to be connected to the P-type silicon substrate 4 and the N-type diffusion layer region 6, respectively. Respective sections of the P-type silicon substrate 4 and the N-type diffusion layer region 6 are exposed. A sample for evaluation of the first preferred embodiment is thus provided.

Next, the aluminum electrode 5 connected to the P-type silicon substrate 4 and a platinum electrode 1 provided in the mixed etchant 2 (e.g., a mixture of alcohol and hydrofluoric acid) are connected in common to a cathode of a DC power supply 3a, and the aluminum electrode 7 connected to the N-type diffusion layer region 6 is connected to an anode of the DC power supply 3a. Of this sample, the exposed sections of the P-type silicon substrate 4 and the N-type diffusion layer region 6 are dipped into the mixed etchant 2 and a voltage not lower than the critical voltage is applied thereto by the DC power supply 3a.

Then, the N-type diffusion layer region 6 works as an anode and is electrolytically polished, while the P-type silicon substrate 4 does not work as an anode and is not electrolytically polished since a PN junction formed in the P-type silicon substrate 4 is reversely biased by the DC power supply 3a.

Therefore, the N-type diffusion layer region 6 is manifested by whether or not being electrolytically polished. After the above treatment, the sample is observed using an SEM or the like for two-dimensional evaluation of the N-type diffusion layer region 6.

Further, if a high voltage which is not lower than the critical voltage is applied to the N-type diffusion layer region 6, the diffusion layer region of low impurity concentration can be manifested. That allows the evaluation of a form of an N-type diffusion layer region of low impurity concentration, which would be impossible in the background art.

Furthermore, the alcohol serves as a buffer to suppress a chemical reaction between the interlayer insulation film 8 and the hydrofluoric acid. The interlayer insulation film 8 made of silicon oxide film of insulating material is not involved in this electrolytic reaction, and accordingly the interlayer insulation film 8 is less etched, as compared with the background art. That is advantageous to the evaluation of a form of the diffusion layer region.

Figure 2:
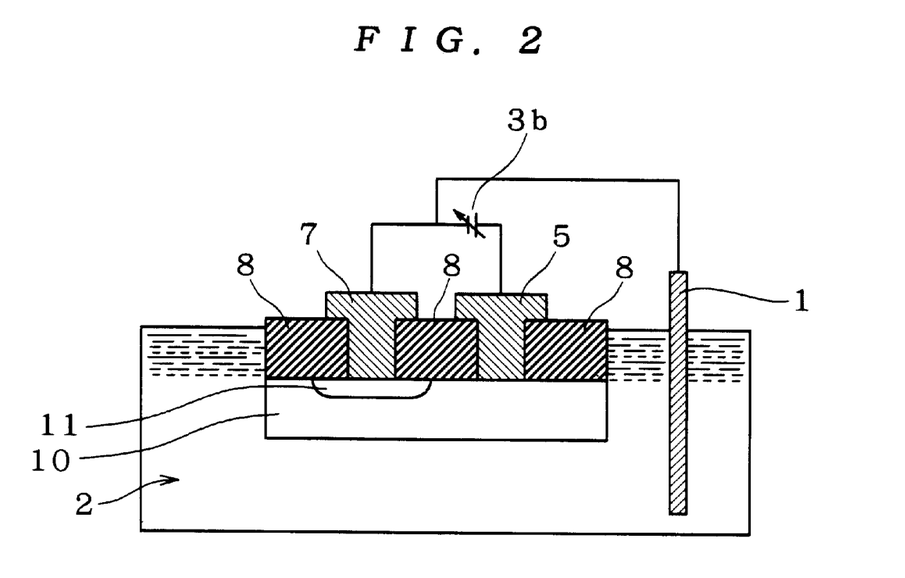

Though the above discussion is made on the sample in which the N-type diffusion layer region 6 is formed inside the P-type silicon substrate 4, another sample in which a P-type diffusion layer region 11 is formed inside an N-type silicon substrate 10 may be used. A DC power supply 3b is connected to this sample so that the N-type silicon substrate 10 may be higher in potential than the mixed etchant 2 and the P-type diffusion region 11, as shown in FIG. 2, and it is observed which part of the exposed section of the sample is electrolytically polished, to achieve a two-dimensional evaluation of a form of the P-type diffusion layer region 11.

The Second Preferred Embodiment

While the first preferred embodiment achieves the two-dimensional evaluation of a form of the sample with its section exposed, the second preferred embodiment achieves a preferable three-dimensional evaluation of a form.

Figure 3:
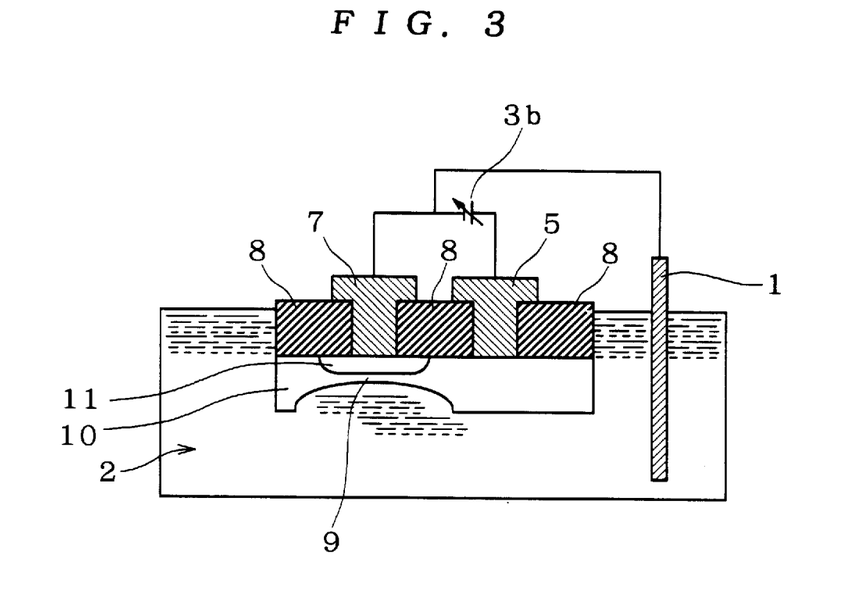
FIGS. 3 and 4 are cross sections each illustrating a method for evaluating a semiconductor device in accordance with a second preferred embodiment of the present invention.

FIG. 3 is a cross section illustrating a method for evaluating a semiconductor device in accordance with the second preferred embodiment of the present invention. First, the P-type diffusion layer region 11 is formed inside the N-type silicon substrate 10. A silicon oxide film, for example, is deposited on the N-type silicon substrate 10 and the P-type diffusion layer region 11 to form the interlayer insulation film 8 and the interlayer insulation film 8 is selectively opened. After that, the aluminum electrodes 5 and 7 are provided so as to be connected to the N-type silicon substrate 10 and the P-type diffusion layer region 11, respectively.

Next, a portion of the N-type silicon substrate 10 immediately below the P-type diffusion layer region 11 is polished to form a thin film-like portion 9. A sample for evaluation of the second preferred embodiment is thus provided. In the second preferred embodiment, it is not necessary to expose the P-type diffusion layer region 11.

Next, the aluminum electrode 7 connected to the P-type diffusion layer region 11 and the platinum electrode 1 provided in the mixed etchant 2 are connected in common to a cathode of a DC power supply 3b, and the aluminum electrode 5 connected to the N-type silicon substrate 10 is connected to an anode of the DC power supply 3b. Of this sample, the N-type silicon substrate 10 including the thin film-like portion 9 and the P-type diffusion layer region 11 is dipped into the mixed etchant 2 and a voltage not lower than the critical voltage is applied thereto by the DC power supply 3b.

Figure 4:
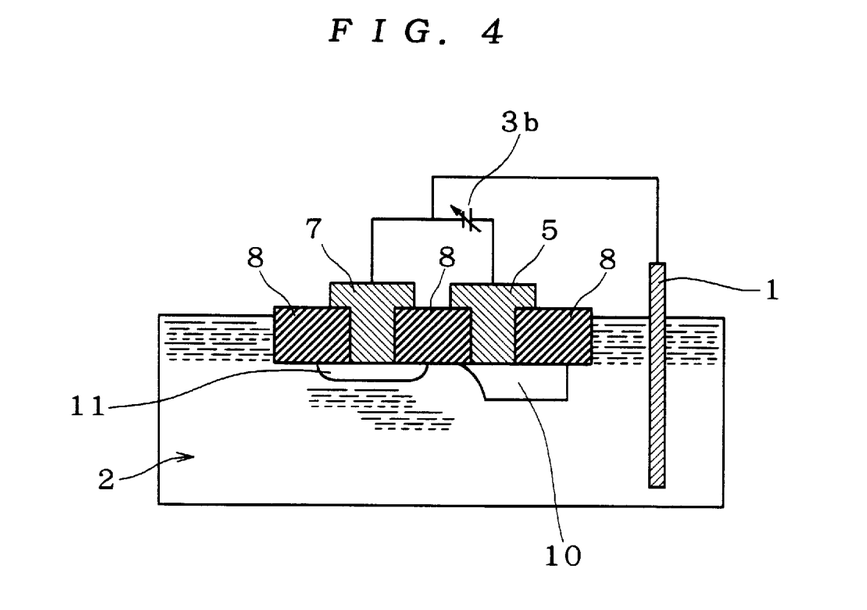

FIG. 4 is a cross section showing the sample after the reaction. The N-type silicon substrate 10 works as an anode and is electrolytically polished, like in the first preferred embodiment, and further electrolytic polishing goes on to three-dimensionally expose the P-type diffusion layer region 11. On the other hand, the P-type diffusion layer region 11 does not work as an anode and is not electrolytically polished since the PN junction between the N-type silicon substrate and the P-type diffusion layer region 11 is reversely biased by the DC power supply 3b.

Since the N-type silicon substrate 10 immediately below the P-type diffusion layer region 11 is polished to be like a thin film in advance, the N-type silicon substrate 10 immediately below the aluminum electrode 5 is not completely electrolytically polished out even if the N-type silicon substrate 10 in the vicinity of the P-type diffusion layer region 11 is electrolytically polished out to expose the P-type diffusion layer region 11. Therefore, it is possible to apply the voltage until the P-type diffusion layer region 11 is completely exposed. After the above treatment, the sample is observed using the SEM, an Atomic Force Microscopy (AFM) or the like for three-dimensional evaluation of the P-type diffusion layer region 11.

The Third Preferred Embodiment

Prior to discussion on this preferred embodiment, another principle of manifestation of a diffusion layer region will be described. When a silicon is connected to a cathode in a metal ion (e.g., copper ion) solution, being supplied with electrons, a surface of the silicon is metallized (e.g., coppered).

(e: electron)

For example, when a sample in which an N-type diffusion layer region is formed inside a P-type silicon substrate is dipped into the metal ion solution and a voltage is applied thereto so that the P-type silicon substrate may be lower in potential than the metal ion solution and the N-type diffusion layer region, the P-type silicon substrate works as a cathode and its surface is metallized and on the other hand the N-type diffusion layer region does not work as a cathode and its surface is not metallized. Therefore, the N-type diffusion layer region can be manifested by whether or not being metallized.

Figure 5:
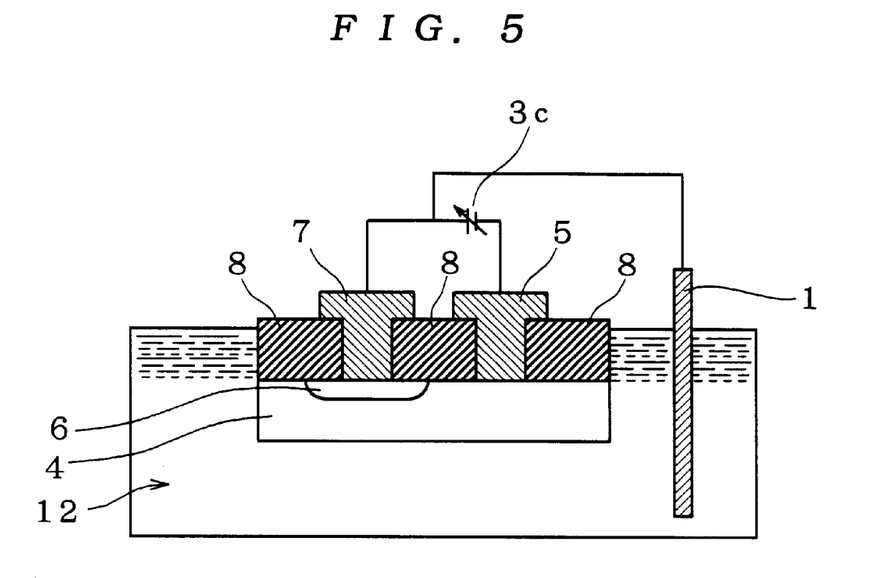
FIGS. 5 and 6 are cross sections each illustrating a method for evaluating a semiconductor device in accordance with a third preferred embodiment of the present invention.

FIG. 5 is a cross section illustrating a method for evaluating a semiconductor device in accordance with the third preferred embodiment of the present invention. First, the N-type diffusion layer region 6 is formed inside the P-type silicon substrate 4. A silicon oxide film, for example, is deposited on the P-type silicon substrate 4 and the N-type diffusion layer region 6 to form the interlayer insulation film 8 and the interlayer insulation film 8 is selectively opened. After that, aluminum electrodes 5 and 7 are provided so as to be connected to the P-type silicon substrate 4 and the N-type diffusion layer region 6, respectively. Respective sections of the P-type silicon substrate 4 and the N-type diffusion layer region 6 are exposed. A sample for evaluation of the third preferred embodiment is thus provided.

Next, the aluminum electrode 5 connected to the P-type silicon substrate 4 is connected to a cathode of a DC power supply 3c, and the aluminum electrode 7 connected to the N-type diffusion layer region 6 and the platinum electrode 1 provided in a metal ion solution 12 (e.g., copper nitrate aqueous solution or copper sulfate aqueous solution) are connected in common to an anode of the DC power supply 3c. Of this sample, the exposed sections of the P-type silicon substrate 4 and the N-type diffusion layer region 6 are dipped into the metal ion solution 12 and a voltage is applied thereto by the DC power supply 3c.

Then, the P-type silicon substrate 4 works as a cathode and its surface is metallized, and on the other hand the N-type diffusion layer region 6 does not work as a cathode and its surface is not metallized since the PN junction between the P-type silicon substrate 4 and the N-type diffusion layer region 6 is reversely biased by the DC power supply 3c. After the above treatment, the sample is observed using the SEM, a Reflection Electron Microscopy (REM) or the like for two-dimensional evaluation of the N-type diffusion layer region 6.

A difference in contrast between the silicon and the metal depends on atomic numbers. For example, if the metal is copper, the copper having larger atomic number is observed brighter. Furthermore, the two-dimensional evaluation of a diffusion layer is achieved by mapping the silicon and the copper using an analysis device, such as an Auger Electron Spectroscopy (AES) or an X-ray Microprobe Analysis (XMA).

Figure 6:
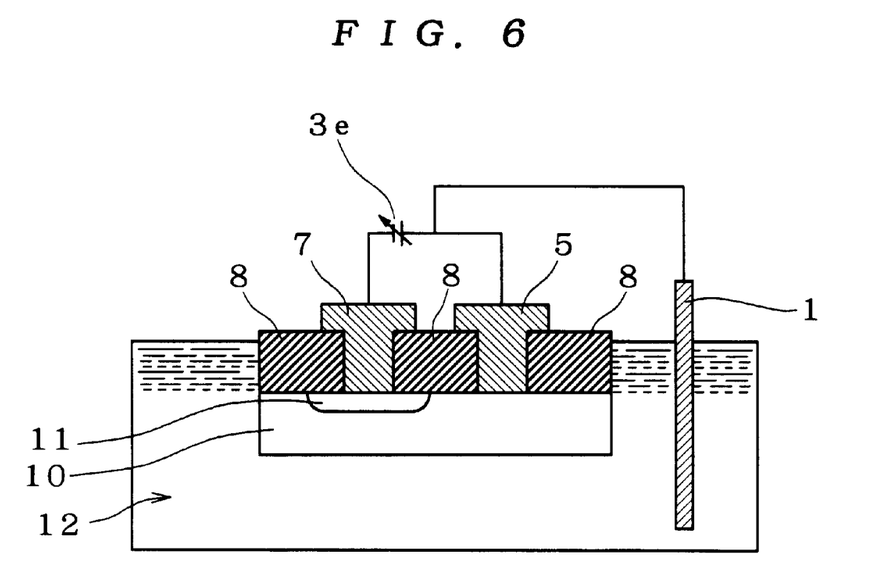

Though the above discussion is made on the sample in which the N-type diffusion layer region 6 is formed inside the P-type silicon substrate 4, another sample in which the P-type diffusion layer region 11 is formed inside the N-type silicon substrate 10 may be used. A DC power supply 3e is connected to this sample so that the P-type diffusion layer region 11 may be lower in potential than the N-type silicon substrate 10 and the metal ion solution 12, as shown in FIG. 6, and it is observed which part of the exposed section of the sample is metallized, to achieve a two-dimensional evaluation of a form of the P-type diffusion layer region 11.

The Fourth Preferred Embodiment

In the first preferred embodiment, there is a possibility that the P-type silicon substrate 4 may be a little etched by hydrofluoric acid since the P-type silicon substrate 4 and the mixed etchant 2 are equal in potential. For better reproducibility in evaluation of a form of a diffusion layer region, it is desirable to completely avoid etching of the P-type silicon substrate 4.

Figure 7:
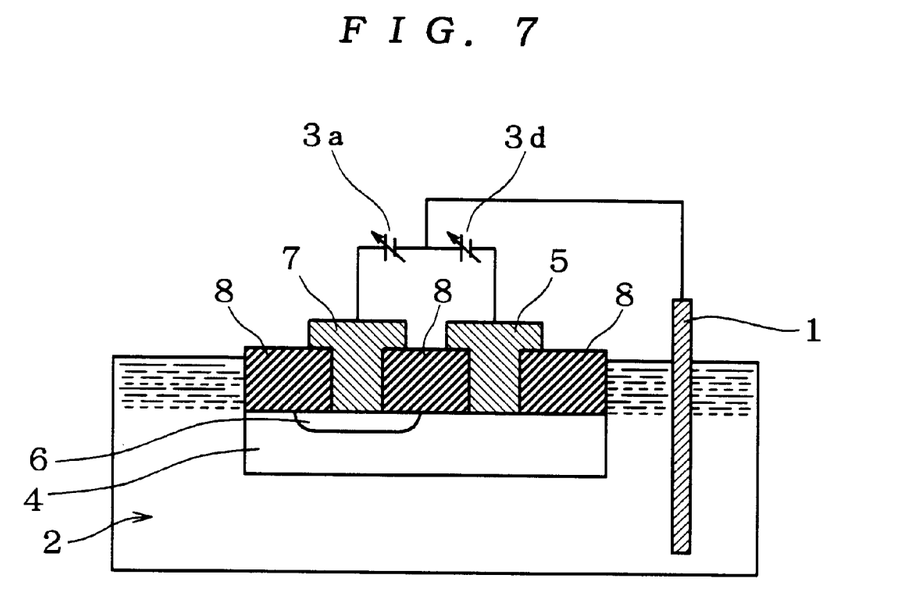
FIGS. 7 and 8 are cross sections each illustrating a method for evaluating a semiconductor device in accordance with a fourth preferred embodiment of the present invention.

FIG. 7 is a cross section illustrating a method for evaluating a semiconductor device in accordance with the fourth preferred embodiment of the present invention. As shown in FIG. 7, a DC power supply 3d is connected between the platinum electrode 1 provided in the mixed etchant 2 and the P-type silicon substrate 4 so that the potential of the platinum electrode 1, in other words, the potential of the mixed etchant 2 may be higher than that of the P-type silicon substrate 4. Then, the P-type silicon substrate 4 works as a cathode, never to be etched by hydrofluoric acid.

For example, if there arises a leak current in the PN junction between the P-type silicon substrate 4 and the N-type diffusion layer region 6, it is possible to completely avoid the electrolytic reaction that the P-type silicon substrate 4 works as an anode, being supplied with positive holes by the DC power supply 3a, and is electrolytically polished. That allows a more accurate two-dimensional evaluation of a form of the N-type diffusion layer region 6.

Figure 8:
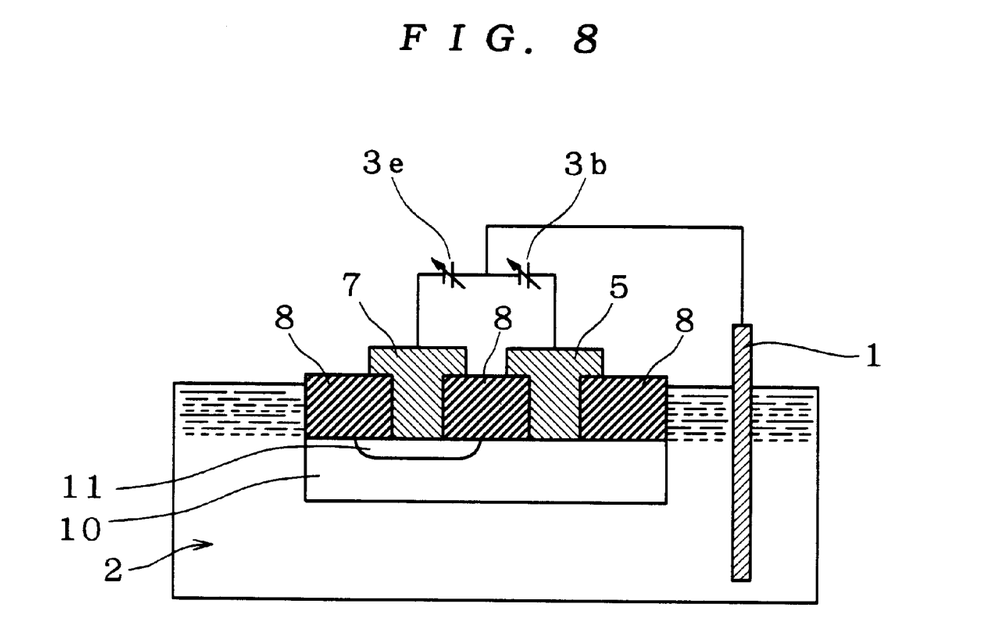

Though the above discussion is made on the sample in which the N-type diffusion layer region 6 is formed inside the P-type silicon substrate 4, another sample in which a P-type diffusion layer region 11 is formed inside an N-type silicon substrate 10 may be used. The DC power supplies 3b and 3d are connected to this sample so that the P-type diffusion layer region 11 may be lower and the N-type silicon substrate 10 may be higher in potential than the mixed etchant 2, as shown in FIG. 8, and it is observed which part of the exposed section of the sample is electrolytically polished, to achieve a two-dimensional evaluation of a form of the P-type diffusion layer region 11.

The Fifth Preferred Embodiment

In the second preferred embodiment, there is a possibility that the P-type diffusion layer region 11 may be a little etched by hydrofluoric acid since the P-type diffusion layer region 11 and the mixed etchant 2 are equal in potential. For better reproducibility in evaluation of a form of a diffusion layer region, it is desirable to completely avoid etching of the P-type diffusion layer region 11.

Figure 9:
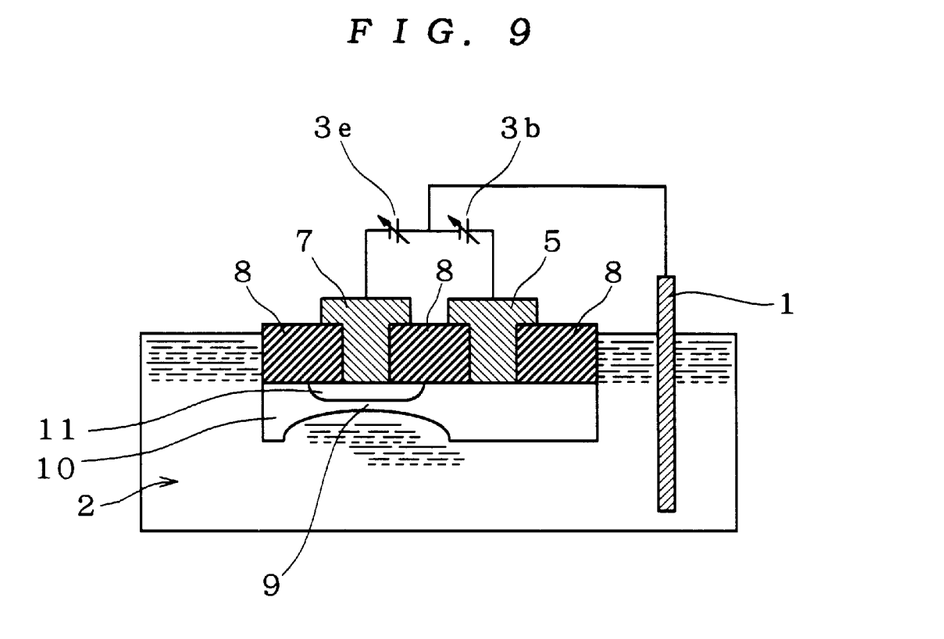
FIG. 9 is a cross section illustrating a method for evaluating a semiconductor device in accordance with a fifth preferred embodiment of the present invention.

FIG. 9 is a cross section illustrating a method for evaluating a semiconductor device in accordance with the fifth preferred embodiment of the present invention. As shown in FIG. 9, the DC power supply 3e is connected between the platinum electrode 1 provided in the mixed etchant 2 and the P-type diffusion layer region 11 so that the potential of the platinum electrode 1, in other words, the potential of the mixed etchant 2 may be higher than that of the P-type diffusion layer region 11. Then, the P-type diffusion layer region 11 works as a cathode, never to be etched by hydrofluoric acid.

For example, if there arises a leak current in the PN junction between the N-type silicon substrate 10 and the P-type diffusion layer region 11, it is possible to completely avoid the electrolytic reaction that the P-type diffusion layer region 11 works as an anode, being supplied with positive holes by the DC power supply 3b, and is electrolytically polished. That allows a more accurate three-dimensional evaluation of a form of the P-type diffusion layer region 11.

The Sixth Preferred Embodiment

In the third preferred embodiment, there is a possibility that the surface of the N-type diffusion layer region 6 may be a little metallized since the N-type diffusion layer region 6 and the metal ion solution 12 are equal in potential. For better reproducibility in evaluation of a form of a diffusion layer region, it is desirable to completely avoid metallization on the surface of the N-type diffusion layer region 6.

Figure 10:
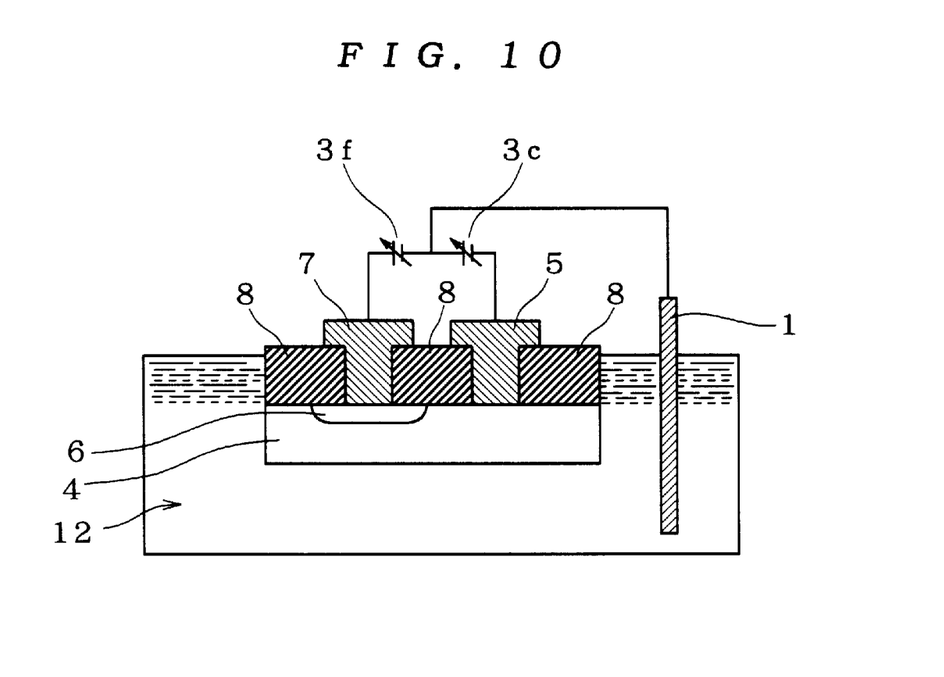
FIGS. 10 and 11 are cross sections illustrating a method for evaluating a semiconductor device in accordance with a sixth preferred embodiment of the present invention.

FIG. 10 is a cross section illustrating a method for evaluating a semiconductor device in accordance with the sixth preferred embodiment of the present invention. As shown in FIG. 10, a DC power supply 3f is connected between the platinum electrode 1 provided in the metal ion solution 12 and the N-type diffusion layer region 6 so that the potential of the N-type diffusion layer region 6 may be higher than that of the platinum electrode 1, in other words, the potential of the metal ion solution 12. Then, the N-type diffusion layer region 6 works as an anode, never to be metallized.

For example, if there arises a leak current in the PN junction between the P-type silicon substrate 4 and the N-type diffusion layer region 6, it is possible to completely avoid the reaction that the N-type diffusion layer region 6 works as a cathode, being supplied with electrons by the DC power supply 3c, and is metallized. That allows a more accurate two-dimensional evaluation of a form of the N-type diffusion layer region 6.

Figure 11:
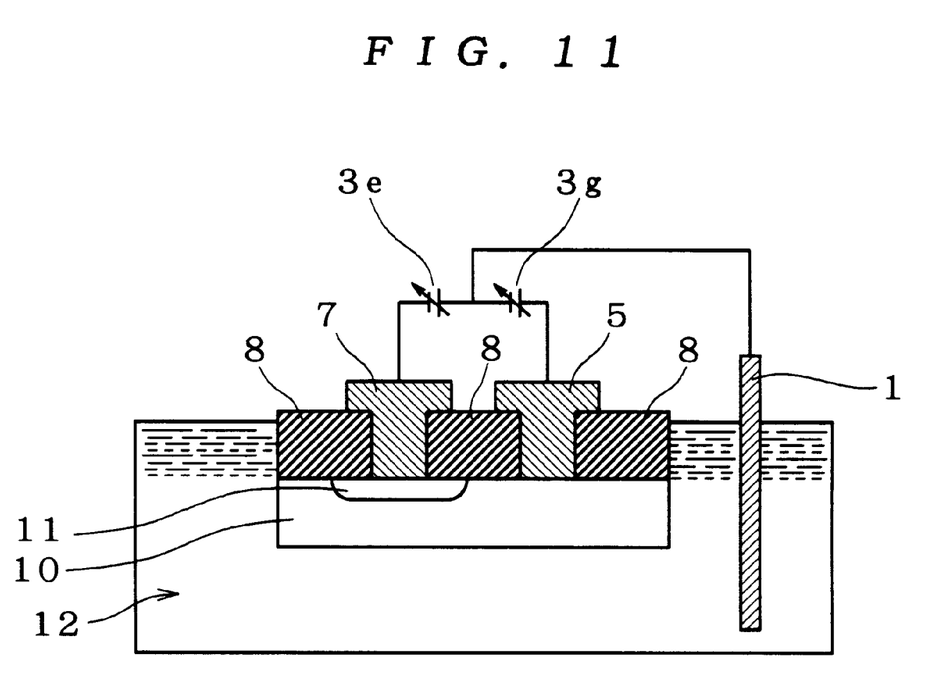

Though the above discussion is made on the sample in which the N-type diffusion layer region 6 is formed inside the P-type silicon substrate 4, another sample in which a P-type diffusion layer region 11 is formed inside an N-type silicon substrate 10 may be used. The DC power supplies 3e and 3g are connected to this sample so that the P-type diffusion layer region 11 may be lower and the N-type silicon substrate 10 may be higher in potential than the metal ion solution 12, as shown in FIG. 11, and it is observed which part of the exposed section of the sample is metallized, for two-dimensional evaluation of a form of the P-type diffusion layer region 11.

Thus, manifestation of a diffusion layer region by electrochemical reaction allows an accurate evaluation of a form even if the diffusion layer region has a low impurity concentration.

While the invention has been shown and described in detail, the foregoing description is in all aspects illustrative and not restrictive. It is therefore understood that numerous modifications and variations can be devised without departing from the scope of the invention.

We claim:

1. A method of evaluating a semiconductor device, comprising the steps of:

(a) dipping said semiconductor device having a semiconductor substrate of N-type conductivity and a diffusion layer region of P-type conductivity into a mixture of hydrofluoric acid and alcohol with at least said semiconductor substrate exposed;

(b) applying a potential to said semiconductor substrate which is higher than a potential of said mixture and which is equal to or higher than a potential of said diffusion layer region; and prior to performing steps (a) and (b), performing the step of:

(c) thinning said semiconductor substrate so as to form a thin semiconductor substrate film between said diffusion layer region and said mixture.

2. The method of claim 1, wherein said step of applying a potential further comprises the step of:

applying a potential to said diffusion layer region which is lower in potential than said potential of said mixture in said step (b).

3. A method of evaluating a semiconductor device, comprising the steps of:

(a) dipping said semiconductor device having a first region of N-type conductivity and a second region of P-type conductivity into a mixture of hydrofluoric acid and alcohol with at least said first region exposed; and (b) applying a potential to said first region which is higher than a potential of said mixture, and applying a potential to said second region which is lower in potential than said potential of said mixture.

4. The method of claim 3, wherein said second region is also exposed in said step (a).

5. The method of claim 4, wherein said first region is a semiconductor substrate and said second region is a diffusion layer region.

6. The method of claim 4, wherein said first region is a diffusion layer region and said second region is a semiconductor substrate.

7. The method of claim 4, wherein said step of applying a potential further comprises the step of:

applying a potential to said second region which is lower in potential than said potential of said mixture in said step (b).

* * * * *